United States Patent
Ikeda et al.

(10) Patent No.: US 8,075,970 B2
(45) Date of Patent: Dec. 13, 2011

(54) HEAT-ACTIVATED ADHESIVE SHEET

(75) Inventors: Koichi Ikeda, Ibaraki (JP); Tsubasa Ueda, Ibaraki (JP); Hironori Tamai, Ibaraki (JP)

(73) Assignee: Nitto Denko Corporation, Ibaraki-shi (JP)

( * ) Notice: Subject to any disclaimer, the term of this patent is extended or adjusted under 35 U.S.C. 154(b) by 646 days.

(21) Appl. No.: 12/005,367

(22) Filed: Dec. 27, 2007

(65) Prior Publication Data

US 2008/0166513 A1    Jul. 10, 2008

(30) Foreign Application Priority Data

Jan. 10, 2007 (JP) .................... 2007-002747

(51) Int. Cl.
*B32B 9/00* (2006.01)
*B32B 33/00* (2006.01)
*B32B 7/12* (2006.01)
*B32B 15/04* (2006.01)

(52) U.S. Cl. ............... 428/40.1; 428/41.3; 428/41.4; 428/41.5; 428/346; 428/355 R

(58) Field of Classification Search .............. 428/40.1, 428/41.3–41.5, 343, 346, 347, 352, 354, 428/355 R, 355 BL
See application file for complete search history.

(56) References Cited

U.S. PATENT DOCUMENTS

| | | | |
|---|---|---|---|
| 5,275,856 A | * | 1/1994 | Calhoun et al. .............. 428/41.1 |
| 6,506,489 B1 | * | 1/2003 | Ohura et al. .................. 428/343 |
| 2005/0266195 A1 | | 12/2005 | Nonaka et al. |

FOREIGN PATENT DOCUMENTS

| | | |
|---|---|---|
| EP | 1595927 A1 | 11/2005 |
| JP | 05-179218 | 7/1993 |

OTHER PUBLICATIONS

Machine translation of JP 05-179218, including Derwent Abstract, claims and detailed description, published Jul. 20, 1993.*
European Search Report dated Sep. 9, 2010, for European Patent Application No. 08000234.8.

* cited by examiner

*Primary Examiner* — Patricia Nordmeyer
(74) *Attorney, Agent, or Firm* — Edwards Wildman Palmer LLP

(57) ABSTRACT

Disclosed is a heat-activated adhesive sheet which includes a heat-activated adhesive layer, and two release liners arranged so as to sandwich and protect the heat-activated adhesive layer. One of the two release liners is a release liner containing a polyolefinic film as a base material, and the other is a release liner containing a polyester film as a base material. This heat-activated adhesive sheet has a transfer heat-activated adhesive layer, can thereby have a small thickness, is unlikely to suffer from "unintended separation", and is unlikely to cause lifting and delamination of release liners when the sheet is stored as a roll.

3 Claims, 1 Drawing Sheet

HEAT-ACTIVATED ADHESIVE SHEET

BACKGROUND OF THE INVENTION

1. Field of the Invention

The present invention relates to heat-activated adhesive sheets.

2. Description of the Related Art

Adhesive sheets typically using pressure-sensitive adhesives have been widely used for fixing electronic components and peripheral devices thereof in so-called "cellular phones", etc., because they have uniform adhesive layers. It is difficult, however, to determine the position of adherends upon adhesion using these adhesive sheets and to reaffix the adhesive sheets, because the pressure-sensitive adhesives should have high tack for reliably bonding adherends. In addition, the adhesive sheets may not sufficiently reliably bond adherends in some portions to be bonded.

As a possible solution to this, Japanese Unexamined Patent Application Publication (JP-A) No. H05-179218 discloses an adhesive sheet using a heat-activated adhesive. It is difficult, however, to allow this adhesive sheet to have a small thickness, because the adhesive sheet includes a layer of a heat-activated adhesive arranged on a base material (backing) such as a nonwoven fabric. Recently, as electronic devices become more and more down-sized and thinned, demands have been made to provide thin heat-activated adhesive sheets.

SUMMARY OF THE INVENTION

To yield a thin heat-activated adhesive sheet, it is effective to use, as a heat-activated adhesive layer, a so-called transfer (backing-less) adhesive layer including no base material (backing) but an adhesive. The heat-activated adhesive sheet of this type, however, suffers from so-called "unintended separation" when a release liner for protecting the heat-activated adhesive layer is peeled off. The "unintended separation" is a phenomenon in which peeling occurs not at a predetermined interface but at another unintended interface.

Accordingly, an object of the present invention is to provide a heat-activated adhesive sheet which includes a transfer adhesive layer, can thereby have a small thickness, and does not get in the state of the "unintended separation".

After intensive investigations by the present inventors so as to achieve the above-mentioned object, the "unintended separation phenomenon" can be inhibited by using different specific release liners as two release liners protecting both sides of a heat-activated adhesive. The present invention has been made based on these findings.

Specifically, according to the present invention, there is provided a heat-activated adhesive sheet which includes a heat-activated adhesive layer and release liners arranged so as to protect the both surfaces of the heat-activated adhesive layer. In this heat-activated adhesive sheet, a release liner for one surface contains a polyolefinic film as a base material, and a release liner for the other surface contains a polyester film as a base material.

In the present invention, the release liner containing a polyolefinic film as a base material may further include a release coating arranged on or above a surface of the polyolefinic film.

The heat-activated adhesive layer may contain a hot-melt adhesive as a heat-activated adhesive, and the hot-melt adhesive may contain one or more styrenic block copolymers and one or more tackifier resins.

A heat-activated adhesive sheet according to the present invention uses a heat-activated adhesive in its adhesive layer, thereby has a low initial adhesiveness, and exhibits improved workability typically in positioning of adherends. After heat treatment, the sheet shows a high adhesiveness and can adhere highly reliably to adherends. The sheet can have a small thickness, because it does not use a base material such as a nonwoven fabric in the heat-activated adhesive layer. In addition, the sheet uses specific release liners, and can thereby inhibit the "unintended separation phenomenon" even though it includes a transfer adhesive layer. The sheet has an improved yield and workability, and thereby excels in productivity.

DESCRIPTION OF THE PREFERRED EMBODIMENTS

Figure 1:
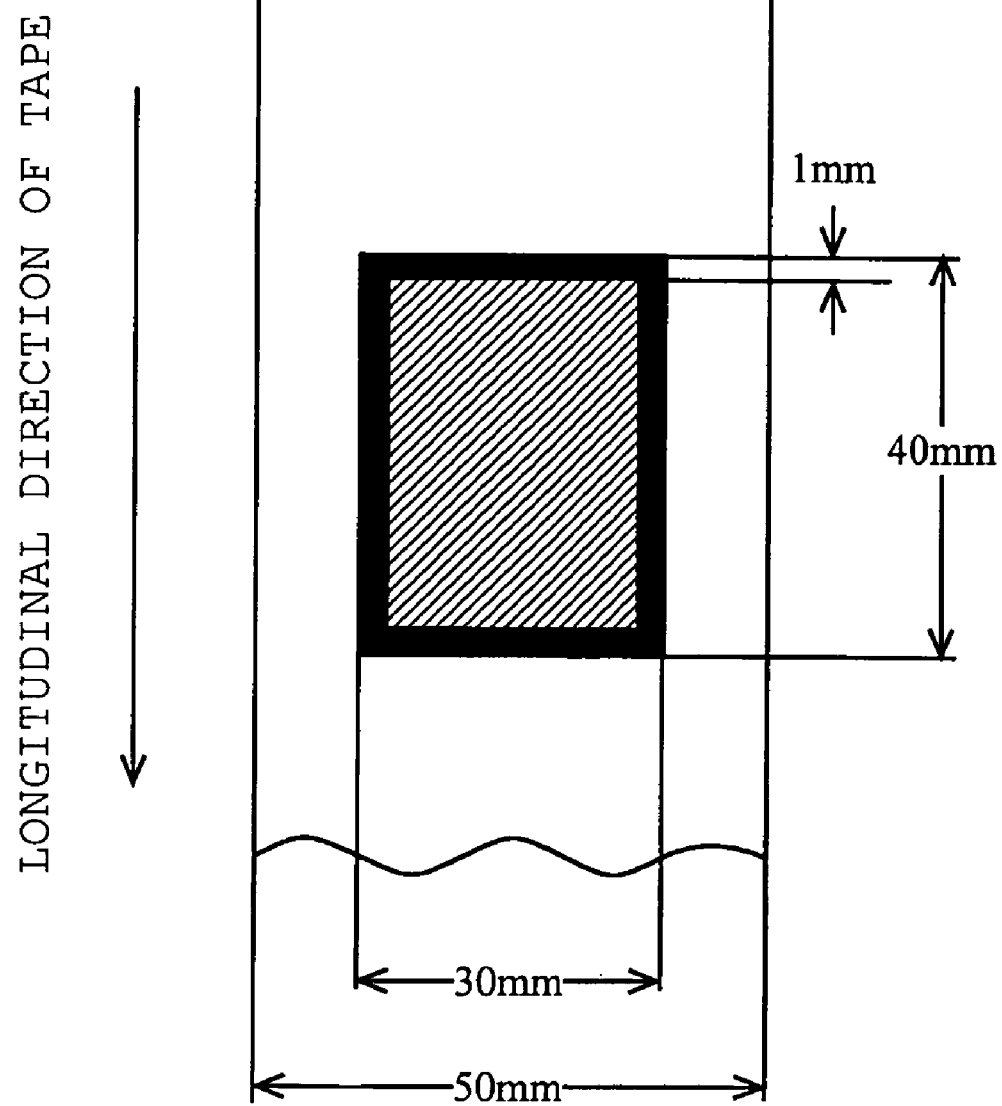
FIG. 1 is a schematic diagram illustrating how a heat-activated adhesive sheet is processed for evaluating lifting of release liners upon processing.

In the present invention, a heat-activated adhesive sheet includes a heat-activated adhesive layer and release liners arranged on or above both sides of the heat-activated adhesive layer so as to protect the heat-activated adhesive layer. The heat-activated adhesive layer is thermoadhesive on both sides. One of the release liners is a release liner containing a polyolefinic film as a base material (hereinafter referred to as "polyolefinic release liner"), and the other is a release liner containing a polyester film as a base material (hereinafter referred to as "polyester release liner").

As is described above, a heat-activated adhesive sheet according to the present invention comprises release liners having different peel forces as two release liners for protecting the both adhesive surfaces of the heat-activated adhesive layer. Accordingly, one release liner which is expected to peel off of the two release liners can be easily peeled off from the adhesive layer by causing peeling at an interface between the subject release liner and the adhesive surface corresponding to the release liner without occurring the "unintended separation phenomenon", more specifically, without causing peeling at the other interface between the other release liner and the other adhesive surface. The term "unintended separation" refers to a phenomenon in which peeling occurs not at a predetermined interface but at another unintended interface.

The polyolefinic release liner arranged on or above one adhesive surface has good adhesion to and fitness for the adhesive surface, and exhibits satisfactory toughness. The liner is unlikely to suffer from lifting and delamination even when the sheet is bent upon each processing, does not cause a space between the surface of the release liner and the adhesive surface, and can remain being affixed to the adhesive surface satisfactorily. If, for example, polyester release liners are arranged on both sides of an adhesive layer, the resulting sheet is likely to suffer from lifting and delamination of the release liners, because these polyester release liners are rigid, less elongate, and are resistant to elongation when being bent.

The heat-activated adhesive sheet according to the present invention has a sheet-like adhesive layer and thereby attains uniform adhesion. It has a smaller initial tack than a pressure-sensitive adhesive, whereby adherends, such as electronic components, can be easily positioned. In addition, it exhibits high adhesiveness after heat activation (thermal adhesion) and thereby sufficiently reliably adheres to adherends.

[Polyolefinic Release Liner]

The polyolefinic release liner can be any of release liners using polyolefinic films (including "sheets") as base materials. The polyolefinic release liner may contain a polyolefinic film alone or may further contain a release coating arranged on or above the surface of the polyolefinic film. The polyolefinic film may have a single-layer structure or a multilayer structure.

The polyolefinic film is composed of one or more polyolefinic resins. The polyolefinic resins include, but are not limited to, polyethylenes such as low-density polyethylenes, linear low-density polyethylenes, metallocene-catalyzed polyethylenes, medium-density polyethylenes, and high-density polyethylenes; polypropylenes; polybutenes such as poly(1-butene)s; poly(4-methyl-1-pentene)s; α-olefin copolymers such as copolymers of ethylene and an α-olefin having three to ten carbon atoms (hereinafter also referred to as "ethylene-α-olefin copolymers"), and copolymers of propylene and an α-olefin having four to ten carbon atoms (hereinafter also referred to as "propylene-α-olefin copolymers"), etc. The olefinic resins include copolymers between ethylene and another component than α-olefins, including, for example, ethylene-unsaturated carboxylic acid copolymers such as ethylene-acrylic acid copolymers (EAA) and ethylene-methacrylic acid copolymers (EMAA); ionomers; ethylene-(meth)acrylic ester copolymers such as ethylene-methyl acrylate copolymers, ethylene-ethyl acrylate copolymers (EEA), and ethylene-methyl methacrylate copolymers (EMMA); ethylene-vinyl acetate copolymers (EVA); and ethylene-vinyl alcohol copolymers, etc. Each of these polyolefinic resins can be used alone or in combination.

In the ethylene-α-olefin copolymers, i.e., copolymers of ethylene and an α-olefin having three to ten carbon atoms, the α-olefin having three to ten carbon atoms is preferably at least one α-olefin (comonomer) selected from the group consisting of propylene, 1-butene, 1-hexene, 4-methyl-1-pentene, and 1-octene. Accordingly, preferred examples of ethylene-α-olefin copolymers include ethylene-propylene copolymers and ethylene-(1-butene) copolymers. In propylene-α-olefin copolymers, the α-olefin having four to ten carbon atoms is preferably at least one α-olefin (comonomer) selected from the group consisting of 1-butene, 1-hexene, 4-methyl-1-pentene, and 1-octene. Accordingly, preferred examples of propylene-α-olefin copolymers include propylene-(1-butene) copolymers.

Polyethylenes, polypropylenes, and ethylene-α-olefin copolymers are preferred as the polyolefinic resins. Among them, polyethylenes are more preferred, of which linear low-density polyethylenes and low-density polyethylenes are especially preferred. The polyolefinic release liner is therefore preferably a polyethylene release liner using a polyethylene film typified by a linear low-density polyethylene film or a low-density polyethylene film.

The thickness of the polyolefinic film is not particularly limited and may be selected as appropriate within ranges of, for example, 5 to 200 μm, preferably 10 to 150 μm, and more preferably 30 to 100 μm.

Polyolefinic resins such as ethylenic polymers can be easily prepared according to known procedures while appropriately selecting polymerization conditions and subsequent purification and separation conditions. Alternatively, commercially available polyolefin products may be used as intact.

A release agent constituting the release coating in the polyolefinic release liner is not particularly limited and can be selected from among known or common release agents. Examples thereof include silicone release agents, fluorinated release agents, long-chain alkyl release agents, fatty acid amide release agents, molybdenum sulfide release agents, and silica powder. Each of these release agents can be used alone or in combination. Silicone release agents are suitably used as the release agent. Such silicone release agents usable herein may be silicone release agents of every kind, such as thermosetting silicone release agents and ionizing radiation-curable silicone release agents.

The thickness of the release coating is not particularly limited and can be selected as appropriate within ranges of, for example, 0.03 to 10 μm, preferably 0.1 to 5 μm, and more preferably 0.3 to 2 μm.

The polyolefinic release liner is preferably a polyolefinic release liner containing a polyolefinic film and a release coating arranged on or above a surface of the polyolefinic film. In this case, the polyolefinic release liner has only to have a release coating on or above at least one surface thereof and preferably has a release coating on or above, in particular, one surface.

In a polyolefinic release liner containing a polyolefinic film and a release coating arranged on or above a surface of the polyolefinic film, the polyolefinic release liner can be prepared, for example, by applying a release agent to at least one surface of the polyolefinic film and drying or curing as the need arises to form a release coating. The release agent is applied to, in particular, only one side of the polyolefinic film.

[Polyester Release Liner]

The polyester release liner arranged on or above an adhesive surface opposite to the polyolefinic release liner is not particularly limited as long as it is a release liner containing a polyester film as a base material. The polyester release liner may include a release coating arranged on or above a surface of the polyester film as the base material. The release coating is arranged on or above, in particular, one side of the polyester film. The polyester film may have a single-layer structure or a multilayer structure.

The polyester film is composed of polyester resins. The polyester resins include, but are not limited to, poly(ethylene terephthalate)s (PET), poly(ethylene naphthalate)s (PEN), poly(butylene terephthalate)s (PBT), and poly(butylene naphthalate)s (PBN). Among them, poly(ethylene terephthalate)s are particularly preferred. Each of these polyester resins can be used alone or in combination.

The thickness of the polyester film can be selected as appropriate within ranges of, for example, 5 to 200 μm, preferably 10 to 150 μm, and more preferably 30 to 100 μm.

A release agent constituting the release coating of the polyester release liner is not particularly limited and can be selected as appropriate from among release agents exemplified relating to the polyolefinic release liner. Examples thereof include silicone release agents, fluorinated release agents, long-chain alkyl release agents, fatty acid amide release agents, molybdenum sulfide release agents, and silica powder. Each of these release agents can be used alone or in combination. Silicone release agents are suitably used as the release agent. Such silicone release agents usable herein may be silicone release agents of every kind, such as thermosetting silicone release agents and ionizing radiation-curable silicone release agents.

The thickness of the release coating is not particularly limited and can be selected as appropriate within ranges of, for example, 0.03 to 10 μm, preferably 0.1 to 5 μm, and more preferably 0.3 to 2 μm.

The polyester release liner can be prepared, for example, by applying a release agent to at least one side of a polyester film, particularly to one side of the polyester film, and drying or curing as the need arises to form a release coating.

These release liners for use in the heat-activated adhesive sheet of the present invention may further include any other layers such as a printed layer, an intermediate layer, and/or an undercoat layer, within ranges not adversely affecting advantages according to the present invention. Examples of the printed layer include printed layers for imparting reflectivity or light blocking effect, and printed layers for increasing decorativeness.

[Heat-Activated Adhesive Layer (Heat-Activated Adhesive)]

The heat-activated adhesive layer of the heat-activated adhesive sheet of the present invention contains a heat-activated adhesive. The term "heat-activated adhesive" as used in the present invention refers to an adhesive which exhibits adhesiveness as a result of heating. The heating is carried out, for example, at about 80° C. to about 150° C. Examples of the heat-activated adhesive include (1) hot-melt adhesives that exhibit adhesiveness with solidifying by cooling after melting by heating, and (2) thermosetting adhesives that exhibit adhesiveness through curing by heating. Among them, hot-melt adhesives are preferred. It should be noted that so-called "pressure-sensitive" adhesives are not included in the heat-activated adhesives for use in the present invention.

The hot-melt adhesive for use herein is not particularly limited, as long as it can exhibit adhesiveness after melting by heating. Preferred examples of the hot-melt adhesive include adhesives each containing a styrenic block copolymer as a base polymer and further containing a tackifier resin.

Preferred examples of the styrenic block copolymer include styrene-conjugated diene block copolymers, of which more preferred are A-B-A block copolymers in which blocks of a styrene polymer and blocks of a conjugated diene polymer are arranged in alternate order. Specific examples include block copolymers of styrene and a conjugated diene such as butadiene or isoprene; and hydrogenated products of them. Among them, styrene-butadiene-styrene block copolymers and hydrogenated products of them are preferred, for achieving high durability.

The content of a styrene polymer in the styrene-conjugated diene block copolymer (hereinafter referred to as "styrene content") is generally 10 to 40 percent by weight, and preferably 13 to 35 percent by weight. The weight-average molecular weight of the entire copolymer is preferably $5 \times 10^4$ to $70 \times 10^4$ and more preferably $10 \times 10^4$ to $40 \times 10^4$.

Examples of the tackifier resin include rosin resins, terpene resins, petroleum resins, hydrogenated petroleum resins, aliphatic hydrocarbon resins, and aromatic hydrocarbon resins. Among them, a styrenic tackifier resin is preferably used as one of essential components. In this case, the styrenic tackifier resin is preferably used in an amount of 10 to 100 parts by weight, and more preferably 20 to 70 parts by weight, to 100 parts by weight of the styrenic block copolymer. This composition is preferred because the resulting sheet shows less tack at room temperature, whereby positioning for fixing electronic components is easily carried out; and adhesion can be easily achieved by heating the sheet after the positioning. In addition to the styrenic tackifier resin, the other tackifier resins are preferably added to the hot-melt adhesive. In this case, the total amount of tackifier resins (the total amount of the styrenic tackifier resin and the other tackifier resins) is preferably 40 to 200 parts by weight to 100 parts by weight of the styrenic block copolymer.

The thermosetting adhesives are not particularly limited as long as they can exhibit adhesiveness as a result of thermal cure. Preferred examples thereof include adhesives each containing an acrylic polymer in combination with an epoxy resin and/or a phenolic resin.

The thickness of the heat-activated adhesive layer is preferably 2 to 100 µm and more preferably 5 to 80 µm, for yielding a thin heat-activated adhesive sheet.

The heat-activated adhesive layer of the present invention is a transfer adhesive layer containing only adhesives, for yielding a thin heat-activated adhesive sheet. The heat-activated adhesive layer generally preferably has a single layer structure, but may have a multilayer structure.

A process for forming the heat-activated adhesive layer is not particularly limited. The layer may be prepared, for example, by applying a heat-activated adhesive diluted with a solvent onto a release liner, and drying or curing according to necessity to yield a heat-activated adhesive layer. The order of application (coating) is not particularly limited, but it is generally desirable that a heat-activated adhesive layer is formed on or above a polyester release liner, and then, a polyolefinic release liner is affixed to the formed heat-activated adhesive layer. The coating of the heat-activated adhesive may be conducted using a common coating device such as a gravure roll coater, reverse roll coater, kiss roll coater, dip roll coater, bar coater, knife coater, or spray coater.

[Heat-Activated Adhesive Sheet]

How to use the heat-activated adhesive sheet is not particularly limited, but it is desirable that the polyolefinic release liner is peeled off at first to use, because the polyolefinic release liner has a smaller peel force with the heat-activated adhesive layer than the polyester release liner has. The peel force between the heat-activated adhesive layer and the polyolefinic release liner in the heat-activated adhesive sheet of the present invention is preferably less than 0.1 (N/50 mm), and more preferably 0.02 to 0.08 (N/50 mm) for inhibiting unintended separation and being satisfactorily peelable. On the other hand, the peel force between the heat-activated adhesive layer and the polyester release liner is preferably less than 1.0 (N/50 mm), and more preferably 0.1 to 0.5 (N/50 mm) for inhibiting unintended separation and exhibiting satisfactory transfer property.

When the heat-activated adhesive sheet of the present invention is wound into a roll before storage, it is desirable to wind the sheet into a roll so that the polyolefinic release liner is faced inward, for inhibiting lifting and delamination of release liners.

Such heat-activated adhesive sheets according to the present invention may be applied to any adhered not particularly limited, but they are preferably used for fixing components of electronic devices, because they can have small thicknesses and excel in workability and adhesion reliability. They can be used, for example, for fixing a silicone keypad and a display board made typically of a polycarbonate or stainless steel in cellular phones.

The adhesion of an adherend using the heat-activated adhesive sheet of the present invention is carried out at a suitable temperature that may vary depending typically on the types of the heat-activated adhesive and the adherend, but is generally preferably carried out at 80° C. to 150° C., and more preferably 90° C. to 130° C.

EXAMPLES

The present invention will be illustrated in further detail with reference to an example below. It should be noted, however, these are illustrated only by way of example and are never construed to limit the scope of the present invention.

Example 1

A heat-activated adhesive composition for a heat-activated adhesive sheet was prepared as a solution by homogenously dissolving 10 parts by weight of styrene-butadiene-styrene block copolymers (Asahi Kasei Chemicals Corporation; as a mixture of Asaprene T430 (5 parts by weight) and Asaprene T420 (5 parts by weight)), 10 parts by weight of a hydrogenated petroleum resin (Arakawa Chemical Industries, Ltd.; ARKON M115), 2.5 parts by weight of a hydrogenated petroleum resin (HERCULES Inc.; PICOTEX #120), 0.2 part by weight of a bisphenol antioxidant (Ouchi Shinko Chemical Industrial Co., Ltd.; Noclac NS-6), and 0.1 part by weight of a bisphenol antioxidant (Ouchi Shinko Chemical Industrial Co., Ltd.; Noclac MB) in 22 parts by weight of toluene and 0.8 part by weight of isopropyl alcohol, and adjusting solid contents to 50 percent by weight.

Next, a heat-activated adhesive sheet was prepared by applying the resulting heat-activated adhesive composition as a solution to a polyester release liner, drying at 100° C. for five minutes to form an adhesive layer of 50 μm thick after drying, and overlaying a polyolefinic release liner containing a polyethylene film as a base material (Oji Paper Co., Ltd.; 80RL-02, opaque, thickness: 80 μm) on the adhesive layer. The polyester release liner included a poly(ethylene terephthalate) film (thickness: 75 μm) as a base material, and a release coating of a silicone release agent applied on one surface of the base material.

Comparative Example 1

A heat-activated adhesive sheet was prepared by applying the heat-activated adhesive composition as a solution prepared in Example 1 to a polyester release liner, and drying at 100° C. for five minutes to form an adhesive layer of 50 μm thick after drying. The polyester release liner herein included a poly(ethylene terephthalate) film (thickness: 75 μm) as a base material, and a release coating of a silicone release agent arranged on or above both surfaces of the base material.

Comparative Example 2

A heat-activated adhesive sheet was prepared by applying the heat-activated adhesive composition as a solution prepared in Example 1 to a polyester release liner, drying at 100° C. for five minutes to form an adhesive layer of 50 μm thick after drying, and overlaying the polyester release liner on the adhesive layer. The polyester release liner herein contained a poly(ethylene terephthalate) film (thickness: 75 μm) as a base material, and a release coating of a silicone release agent arranged on or above one surface of the base material.

(Evaluations)

Properties of the heat-activated adhesive sheets prepared according to Example 1 and Comparative Examples 1 and 2 were evaluated in the following manner, and the results are shown in Table 1.

The heat-activated adhesive sheet according to Example 1 could be satisfactorily unwound from a roll, because the adhesive layer was protected with release liners on both surfaces. In addition, the release liners could be easily peeled off from the heat-activated adhesive layer without causing the "unintended separation phenomenon". The heat-activated adhesive sheet showed no "lifting" of release liners even when it was wound into a roll and when it was processed.

In contrast, the heat-activated adhesive sheet according to Comparative Example 1 suffered from "unintended separation" when it was unwound. The heat-activated adhesive sheet according to Comparative Example 2 suffered from "unintended separation" when the release liners were peeled off, and it also suffered from "lifting" of the release liners when it was wound into a roll and when it was processed.

(1) "Unintended Separation" Upon Unwinding of Roll into Sheet

The heat-activated adhesive sheets (500 mm wide) according to Example 1 and Comparative Examples 1 and 2 were wound into rolls (3-inch core, winding length: 100 m) and thereby yielded rolled products 500 mm wide and 100 m long. The heat-activated adhesive sheet according to Example 1 was wound so that the polyolefinic release liner faced inward. The heat-activated adhesive sheet according to Comparative Example 1 was wound so that a side bearing no release liner faced inward.

Then, the rolls were unwound into sheets at unwinding rates of 1, 10, and 30 m/minute, and whether or not the adhesive sheets suffered from "unintended separation" were observed in a region of 0 to 30 m from the starting point of winding.

(2) "Unintended Separation" Upon Peeling of One of Two Release Liners

This evaluation was made only on the heat-activated adhesive sheets according to Example 1 and Comparative Example 2. Specifically, one of two release liners (the polyolefinic release liner in the heat-activated adhesive sheet according to Example 1) was peeled off from the heat-activated adhesive sheets (500 mm wide) according to Example 1 and Comparative Example 2 at peeling rates of 1, 10, and 30 m/minute. Whether or not the adhesive sheets suffered from "unintended separation" during this procedure was observed. The peeling was conducted using the product of MCK CO., LTD. under the trade names of Model MNS-800.

(3) Lifting of Release Liner in Rolled Products

The heat-activated adhesive sheets according to Example 1 and Comparative Examples 1 and 2 were wound into rolls and thereby yielded rolled products 500 mm wide and 100 m long by the same procedure as "(1)".

Then, whether or not lifting of the release liners occurred was observed from the lateral side of the rolls.

(4) Lifting of Release Liner During Processing

This evaluation was made only on the heat-activated adhesive sheets according to Example 1 and Comparative Example 2. Specifically, the heat-activated adhesive sheets according to Example 1 and Comparative Example 2 were wound into rolled tapes 50 mm wide, and the tapes were processed from a side of an inner release liner (the polyolefinic release liner in the heat-activated adhesive sheet according to Example 1) in a 1-mm frame 30 mm wide and 40 mm long (FIG. 1). The diagonally shaded area in FIG. 1 was cut off, and the interface between the area indicated by filled frame and the area indicated by whiteness was half-cut in which only the inner release liner and the heat-activated adhesive layer were cut with blade, and the outer release liner serving as a mount was not cut with blade.

In the area indicated by whiteness, only the inner release liner and the heat-activated adhesive layer were peeled off, and the outer release liner serving as the mount was not peeled off. Then, whether or not the release liner in the area indicated by filled frame underwent lifting was observed.

This processing was conducted with the product of ISIS Inc. under the trade name of Model 85040.

TABLE 1

| Property | | Example 1 | Comparative Example 1 | Comparative Example 2 |
|---|---|---|---|---|
| "Unintended separation" | Upon rewinding of roll into sheet | no | yes | no |
| | Upon peeling of one of two release liners | no | — | yes |
| Lifting of release liner in rolled product | | no | no | yes |

TABLE 1-continued

| Property | Example 1 | Comparative Example 1 | Comparative Example 2 |
| --- | --- | --- | --- |
| Lifting of release liner upon processing | no | — | yes |

It should be understood by those skilled in the art that various modifications, combinations, subcombinations, and alterations may occur depending on design requirements and other factors insofar as they are within the scope of the appended claims or the equivalents thereof.

What is claimed is:

1. A heat-activated adhesive sheet comprising
a heat-activated adhesive layer, which is a transfer adhesive layer including no base material, and
release liners arranged so as to protect both surfaces of the heat-activated adhesive layer,
wherein one release liner of the release liners for one surface of the surfaces contains a polyolefinic film as a base material and a release coating constituted by a silicone release agent arranged on or above a surface of the polyolefinic film, and the other release liner of the release liners for the other surface of the surfaces contains a polyester film as a base material and a release coating constituted by a silicone release agent arranged on or above a surface of the polyester film.

2. A heat-activated adhesive sheet according to claim 1, wherein the heat-activated adhesive layer comprises a heat-activated adhesive being a hot-melt adhesive, and the hot-melt adhesive contains a styrenic block copolymer and a tackifier resin.

3. A heat-activated adhesive sheet according to claim 1, wherein the polyolefinic film as the base material has a single-layer structure.

* * * * *